United States Patent [19]

Maier et al.

[11] Patent Number: 4,978,117
[45] Date of Patent: Dec. 18, 1990

[54] APPARATUS FOR CONVEYING PRINTING PLATES

[75] Inventors: Willy Maier, Kloten; Thomas Bachmann; Martin Konrad, both of Zurich; Markus Staub, Geroldswil, all of Switzerland

[73] Assignee: Daverio AG, Zurich, Switzerland

[21] Appl. No.: 333,050

[22] Filed: Apr. 3, 1989

[30] Foreign Application Priority Data

Apr. 8, 1988 [CH] Switzerland ................. 1303/88-7

[51] Int. Cl.⁵ ............................................. B65H 29/04
[52] U.S. Cl. .................................. 271/206; 271/296; 198/803.9
[58] Field of Search ............... 271/34, 90, 91, 93, 271/195–197, 204–207, 296; 198/350, 803.9

[56] References Cited

U.S. PATENT DOCUMENTS

| 2,756,995 | 7/1956 | Koch | 271/206 |
|---|---|---|---|
| 3,032,341 | 5/1962 | Reist | 271/206 |
| 3,186,709 | 6/1965 | Peyrebrune | 271/206 |
| 3,884,370 | 5/1975 | Bradshaw et al. | 198/350 |
| 3,960,264 | 6/1976 | Carbine et al. | 271/204 |
| 4,448,408 | 5/1984 | Faltin | 271/204 |
| 4,449,813 | 5/1984 | Kikuchi et al. | 271/296 |
| 4,638,906 | 1/1987 | Winiasz | 198/803.9 |
| 4,643,414 | 2/1987 | Weisgerber | 271/206 |
| 4,681,213 | 7/1987 | Winiasz | 271/206 |
| 4,746,007 | 5/1988 | Houseman | 271/204 |
| 4,789,148 | 12/1988 | Noguchi et al. | 271/34 |

FOREIGN PATENT DOCUMENTS 86-03476 6/1986 PCT Int'l Appl. .............. 198/803.9

Primary Examiner—H. Grant Skaggs
Assistant Examiner—Steve Reiss
Attorney, Agent, or Firm—Weiser & Stapler

[57] ABSTRACT

Flexible printing plates are produced by a printing plate producing machine and then transferred at a transfer station to a series of grippers mounted on an endless roller chain and which can be swiveled and opened by cooperating connecting links to engage the printing plates. The printing plates are then brought to an unloading station where the grippers are pneumatically opened in a receiving head and the printing plates are dropped into a plate stacker for guiding the printing plates into a series of bins.

14 Claims, 4 Drawing Sheets

APPARATUS FOR CONVEYING PRINTING PLATES

BACKGROUND OF THE INVENTION

The present invention generally relates to devices for handling printing plates, and in particular, to a device for conveying flexible printing plates following their manufacture.

State of the art conveying devices generally include a container having a drive mechanism which runs along profiled rails to draw the printing plates along their desired path. The container is manually loaded with printing plates, which are in turn programmed to reach their objective automatically. Upon reaching this objective, the plates are then removed from the container manually. However, since such printing plates tend to accumulate irregularly, and since such printing operations are frequently carried out at night, manual operation of the conveying device becomes rather costly. What is more, sensitive printing plates, especially so-called "flexo plates" made of plastic, tend to require especially careful treatment, and such state of the art devices often failed to guarantee this.

Also known are belt conveyors having boxes which travel on a belt and along their desired path. However, since such devices are also manually loaded and unloaded with printing plates, the above-mentioned difficulties are again presented.

SUMMARY OF THE INVENTION

The principal object of the present invention is to provide a conveying device which automatically receives, conveys and releases printing plates in desired fashion.

It is also an object of the present invention to provide a device which can safely and automatically convey flexible printing plates, or so-called "flexo plates".

These and other objects are achieved in accordance with the present invention by providing an apparatus which automatically receives the printing plates from the device which produces them, and which thereafter automatically releases the printing plates when they reach their desired destination. The printing plates are then located near the folding apparatus, ready for use. The printing plates are capable of being received and released while moving, so that the conveyor chain does not have to be stopped. This makes possible a rather fast conveying rate. A flexible (twistable) conveyor chain is provided to permit the conveyor system to be guided along ascending and descending paths, as well as along curves, if desired.

To be noted is that the guiding chain passes horizontally along the profiled rails of the system in its predominantly straight regions, and runs on rollers, so that wear on the chain is reduced and so that the power consumed by the drive mechanism is kept low.

When conveying flexo plates, steps are taken to cause the folded plate edges to run perpendicular to the engaged edge of each plate so that the folds serve to reinforce the plates and help prevent them from bending and flapping, even when moved rapidly by the conveyor system. Furthermore, printing plates with unusual or very large formats can also be conveyed by the grippers of the system, without modification.

Further detail regarding the conveying system of the present invention may be had with reference to the description which is provided below, together with the following drawings.

BRIEF DESCRIPTION OF THE DRAWINGS

In the several views provided, like reference numerals denote similar structure.

Detailed Description of the Preferred Embodiment

Figure 1:
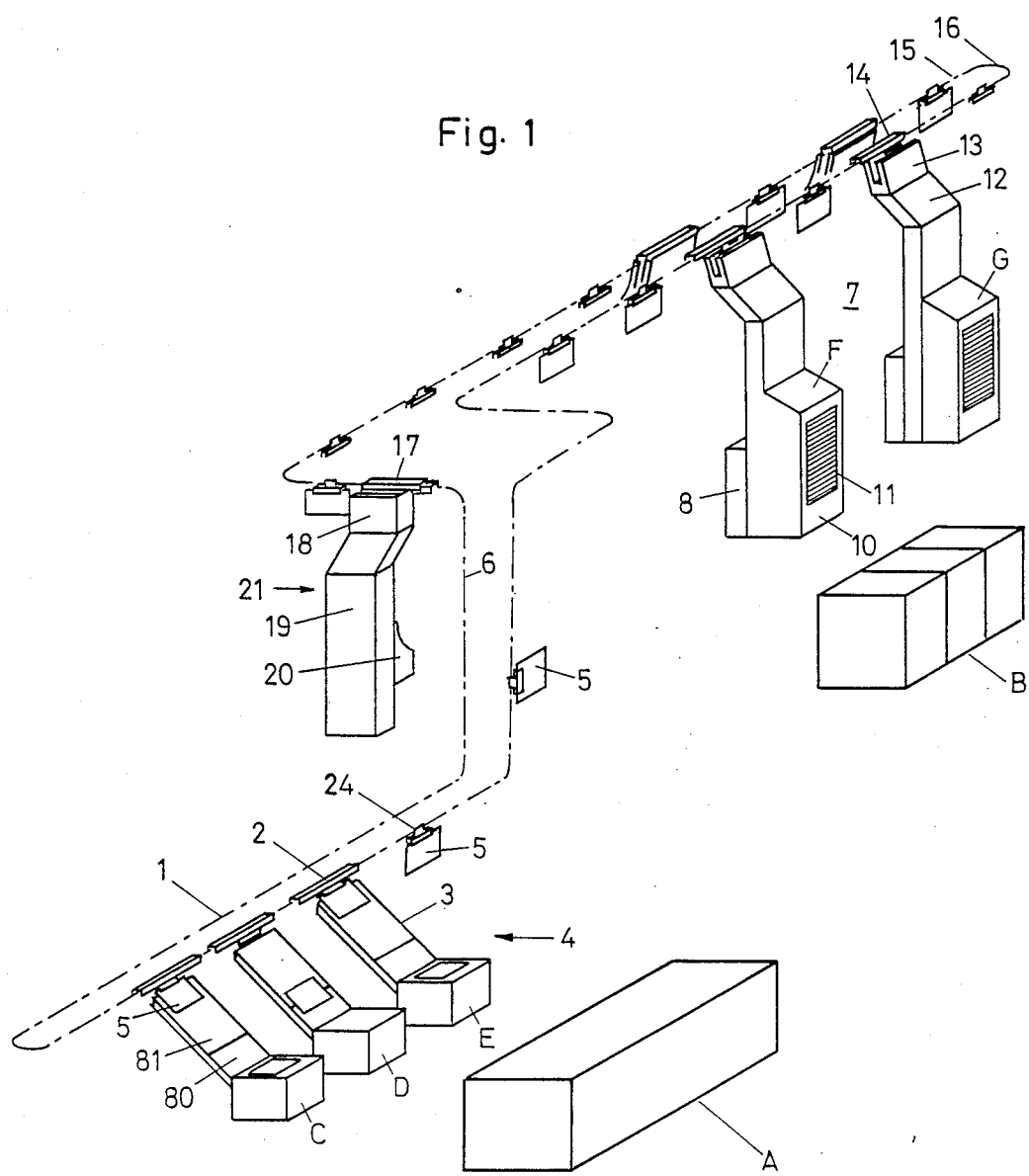
FIG. 1 shows a perspective, schematic representation of a conveyor system according to the present invention.
Figure 2:
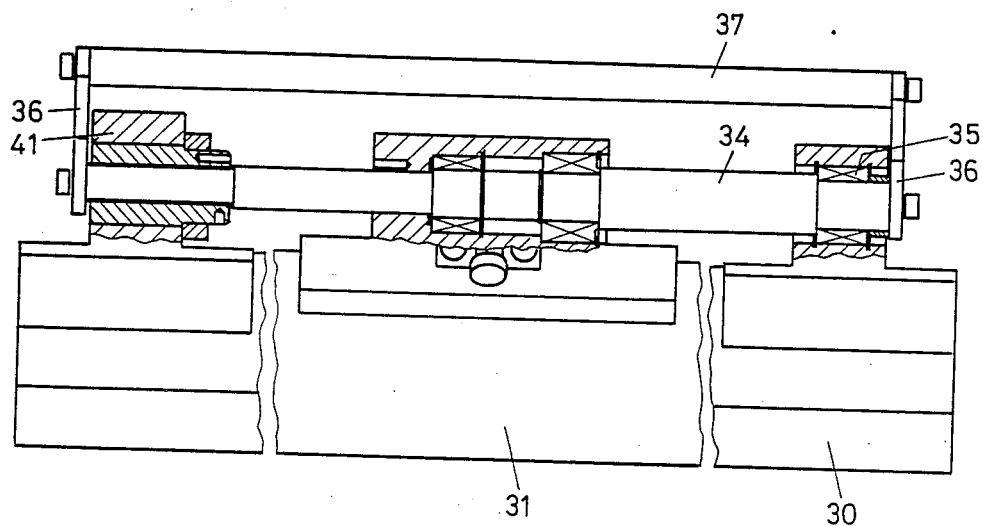
FIG. 2 shows a partially sectioned, top plan view of the conveyor's gripper.
Figure 3:
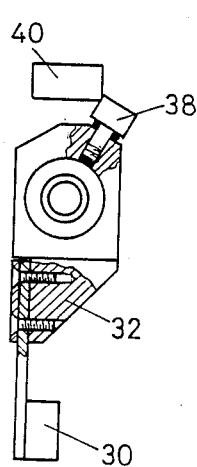
FIGS. 3 and 4 shows partially sectioned end views of the gripper.
Figure 4:
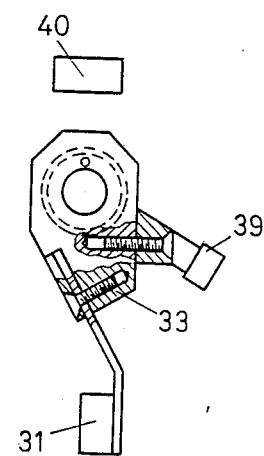

FIG. 1 schematically shows an apparatus for individually conveying flexible printing plates 5 from a printing plate producing machine A to one or more folding devices B. The printing plates 5 are thus conveyed from the production room to the rotation room, which may even be situated on different floors.

Near the printing plate producing machine A is a transfer station 4 which receives the printing plates 5 from the plate producing machine A and places them in a transfer position where they can be taken up by the grippers 24. To this end, the transfer station 4 includes a series of three units C, D, E (each of which has a light switch to initiate operation) which, upon the passage of a printing plate, starts an intake chain which conveys the printing plate 5 along a slanted path (i.e. ascending at about 45°). After the printing plate 5 has initially been conveyed along the region 80 of the ascending area 3 (e.g., for about 180 mm), it is engaged by more rapidly running rollers in the region 81 and is pulled off the intake chain, reaching the transfer position at the end of the ascending area 3. In this latter position, the printing plate 5 is held in place by pneumatic nozzles (not shown) and a light switch gives a signal that the printing plate 5 is ready for transfer to the conveyor system.

The printing plate 5 which is then ready for transfer is thereafter transported to an unloading station 7 by a conveyor chain 1 having a series of grippers 24 which are hingedly mounted about two meters apart. If a printing plate 5 is ready for transfer, as is the case for the units C and E, the grippers 24 are brought into a slanted position of about 45° and opened by a connecting link 2. As an opened gripper 24 passes the printing plate 5, the printing plate 5 is grasped by the closing gripper 24, and is pulled off the transfer table. Thereafter, the engaged printing plate 5 is brought to a vertically suspended position, for further transport as shown. The speed of the conveyor chain 1 is not changed at this time. In the event that a gripper 24 holding a printing plate 5 passes through the transfer station 4, the gripper 24 and plate 5 are not swiveled in this region, but rather are passed through the transfer station 4 in a vertically suspended orientation to avoid contacting the units C, D, E in the process.

Figure 5:
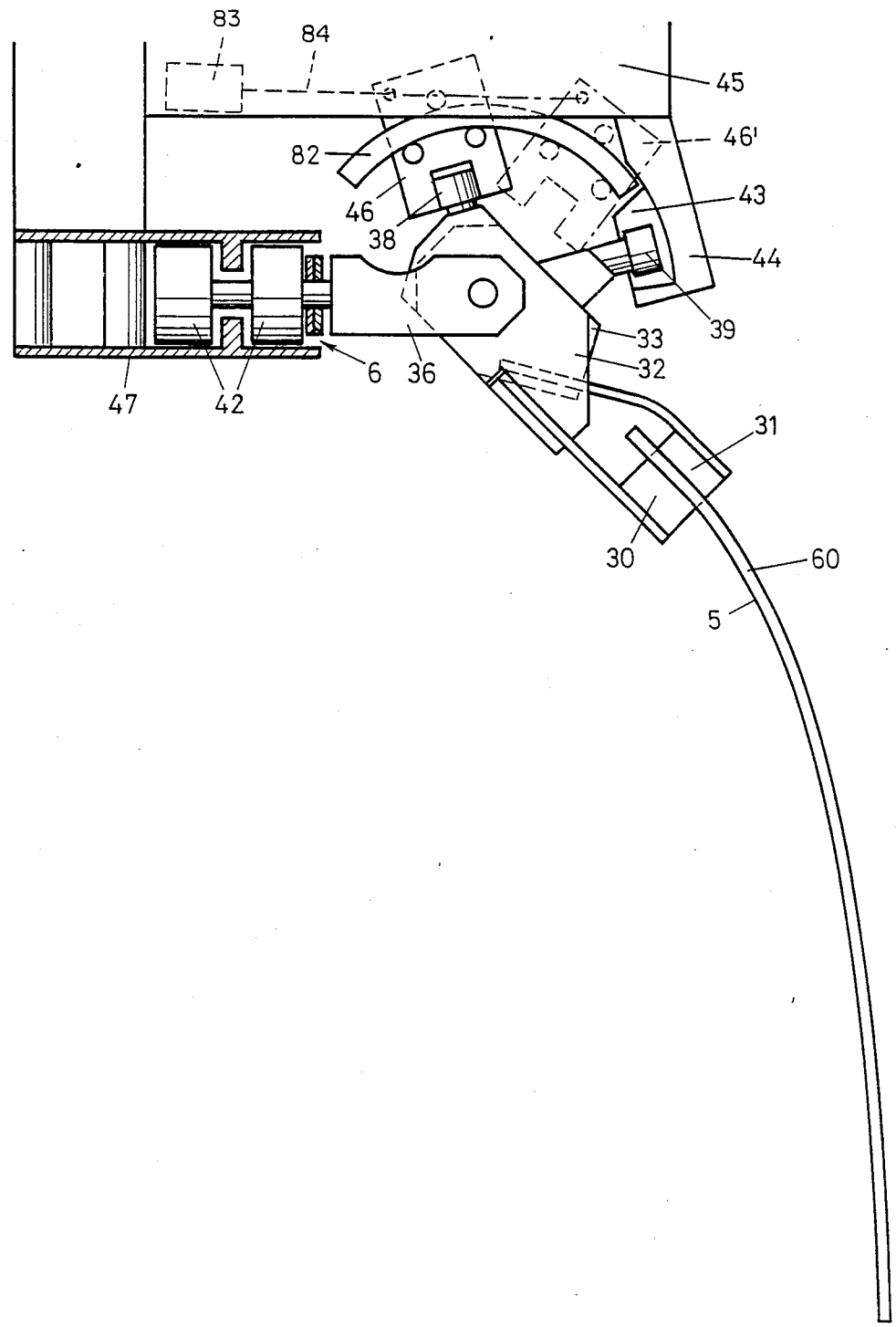
FIG. 5 shows a cross-sectional view of the profiled rail and gripper, grasping a flexible printing plate.

FIGS. 2 through 5 show the structure of a gripper 24 in more detail. The ends of a connecting rod 37 are affixed to a pair of plates 36, which in turn receive an axle 34. As FIG. 5 shows, the connecting rod 37 further connects the gripper 24 to the links of a roller chain 6.

Two clamping jaws 32, 33 are in turn hingedly mounted on the axle 34, and are held in a closed position by a coil spring (not shown). Rubber strips 30, 31 are installed at the free ends of the clamping jaws 32, 33 which grasp the printing plate 5.

The clamping jaw 33 has a cam roller 39 which runs along an area 43 of an opening link 44, to open the gripper 24. The other clamping jaw 32 also has a cam roller 38, which serves to swivel the gripper 24 into its desired position responsive to a second connecting link 46. The connecting link 46 is movable, and operates to swivel the gripper 24 into a working position to receive a printing plate 5. As previously indicated, if the gripper 24 is already loaded with a printing plate 5, or if no printing plate 5 is ready for transfer, the connecting link 46 is caused to remain in a position which will not engage the gripper 24 as it passes the connecting link 46. In such case, the gripper 24 passes the transfer station C D or E in a vertical position. The position in which the link 46' is not in a working position is shown in FIG. 5 with dotted lines. A pneumatic cylinder 83 with piston 84 moves the second connecting link 46, which is slidably guided on guide 82.

The printing plates 5, which are made of plastic, each have a fold 60 on their opposing edges which runs vertically with respect to the edge by which the printing plate 5 is grasped by the gripper 24. The folds 60 operate to reinforce the printing plates 5 when grasped in this manner, thus preventing bending and flapping of the printing plates during their transport. This is also especially important when the printing plates are handled at the unloading station, which will be described more fully below. It should be noted here that flexo plates are very sensitive, and if even slightly bent, are totally useless.

The otherwise conventional roller chain 6 has rollers 42 which run, for the most part horizontally, in a rail 47 as shown in FIG. 5. Especially in the turning area 16, where a drive mechanism (not shown) and a tension station (not shown) are provided, the rails 47 are rotated 90° about their longitudinal axis so that the roller chain 6 is hanging in the rails 47. As a result of this the roller chain 6 can be protected, and in addition, turned about a small radius as well as in vertical partial segments. The rails 47 and the connecting links 44, 46 are mounted on an appropriate support 45 which operates to retain these several elements in their proper position relative to one another.

When a gripper 24 loaded with a printing plate 5 has reached the unloading station 7, the gripper 24 is again swiveled to run into a receiving head 13. If the gripper 24 is not loaded with a printing plate 5, or if a unit F or G of the unloading station 7 is not to be addressed, for example, because it cannot accept any more printing plates 5, then the gripper 24 is not swiveled into the unit but rather runs vertically by it.

Figure 6:
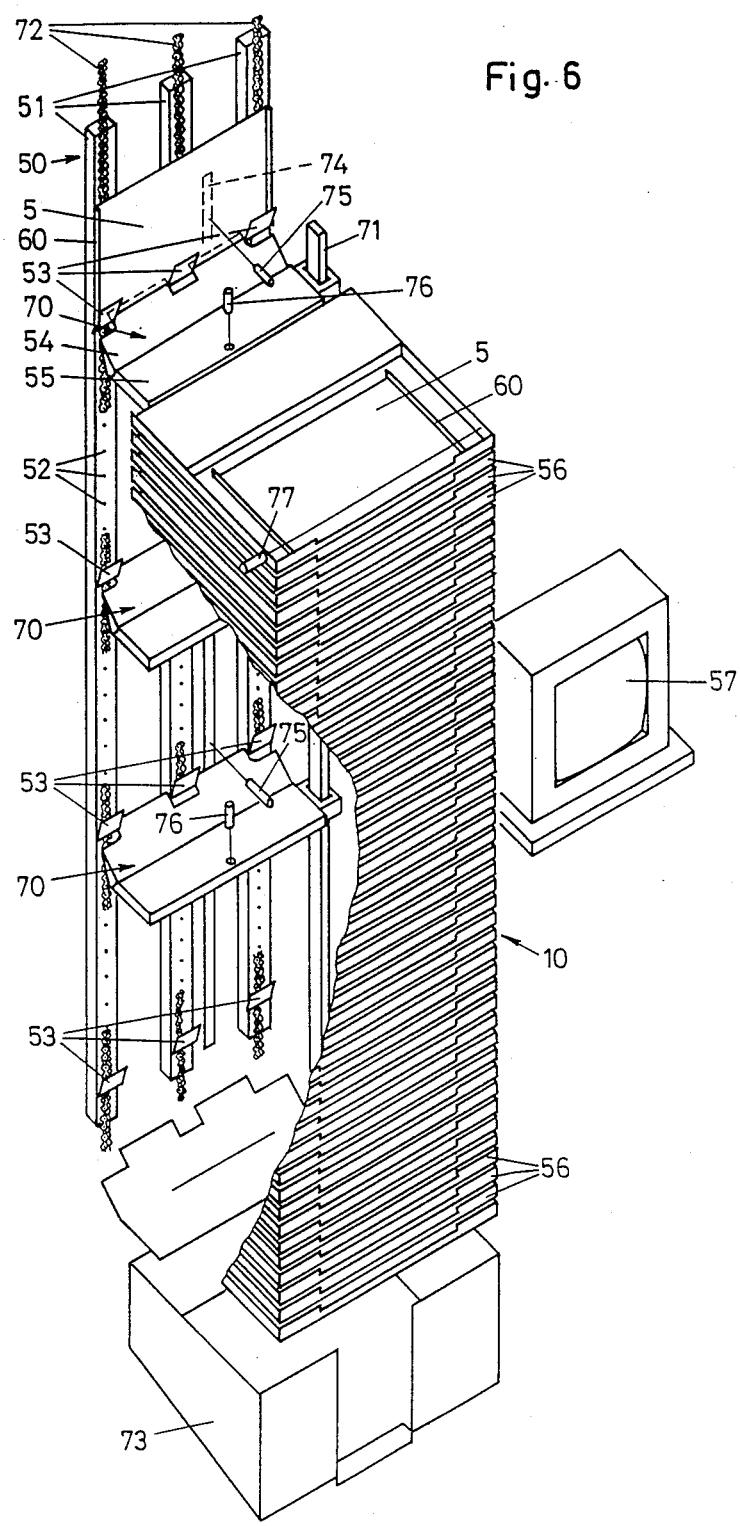
FIG. 6 shows a perspective view of the unloading station, with portions broken away to reveal construction detail.

A gripper 24 driven into the unloading head 13 is opened pneumatically and the printing plate 5 is dropped into a hopper 12 and moved vertically downward within the unit by a conveyor 50, as shown in FIG. 6. Each printing plate 5 passes through the unloading station 7, but the gripper 24 is caused to open only if the printing plate 5 is in its preassigned unloading head (provided that more than one unloading head is used). To this end, each unloading head 13 cooperates with a movable connecting link 14 which is arranged along the upper portion of the unloading head 13, and which operates to open the gripper 24 similarly to the previously described connecting link 2 (and the cooperating links 44, 46). Also provided are a side flap which serves as an end stop for the printing plate 5 which is dropped into the receiving hopper, a bottom flap which serves as a bottom stop of the receiving hopper, and takeoff rollers which serve to accomplish the selective transportation of printing plates 5 from the receiving hopper.

Each unloading unit F, G further comprises a plate stacker 10 positioned below the unloading head 13, and having receiving slots 11 for accepting the stacked printing plates 5. The printing plates 5 supplied to the plate stacker 10 are stored in a series of bins 56. By electronically controlled preselection, a bin 56 is assigned to each printing plate. The electronics recognize free bins 56 in the plate stacker 10 and assign the printing plates 5 to them, as available. An image screen 57 shows which printing plate 5 is located in which of the bins 56. In this way, it is possible to store the printing plates 5 in sorted fashion, before they are processed on the folding apparatus B.

As FIG. 6 shows, the plate stacker 10 is equipped with three sorting carts 70 which serve the bins 56 assigned to them. The sorting carts 70 are directed along a guide 71 and are connected to one another, preferably at a fixed distance from one another. Each sorting cart 70 is equipped with a flap 54 which can be shifted into two positions. In the working position, the flap 54 is swiveled in and lifts the arriving printing plate 5 out of the plate holder 53 which operates to receive the printing plate 5 from the unloading head 13 and which is mounted on an endless drive chain 72. In the inactive position, the flap 54 is swiveled out to allow the printing plate 5 to pass by. This would be the case when one of the three sorting carts 70 is located at an already occupied bin 56, or an unidentified printing plate 5 must be passed into the overflow container 73.

The drive chains 72 run on guide rails 51 which have nozzle openings 52 in their front. A vacuum is developed in the guide rails 51 so that the printing plates 5 are held to the rails 51, thereby holding the printing plates 5 in a vertical position. The drive chains 72 can also be arranged beside the guide rails 51, so that the adhesion of the printing plates 5 is further improved. Since the printing plates 5 are relatively rigid as a result of their folded edges, a relatively low vacuum on the printing plates 5 is sufficient for this purpose. The passage of a printing plate 5 is detected by a light switch 75, which operates in conjunction with a mirror strip 74. Other light switches 76, 77 operate to detect the entrance of the printing plates 5 into the bins 56 and thus determine which bins 56 are occupied or free.

The printing plates 5 in this example are flexible plastic sheets, which are generally known as "flexo plates". However, with appropriate adaptations, the transportation of other printing plates such as offset plates is also possible in accordance with the present invention.

Referring again to FIG. 1, an unloading unit 21 is arranged along the transportation device following the unloading units F, G. At this unloading unit 21, all grippers 24 passing through the unit are opened by means of a connecting link 17 associated with an unloading head 18. Any printing plates 5 still present at this point will be received within a shaft 19 and passed to a receiving container 20. This unloading unit 21 operates without light switches or other devices which may fail, so that even in the case of malfunctions the grippers 24 always enter the transfer station C, D, E empty and ready to accept a printing plate 5.

It will be understood that various changes in the details, materials and arrangement of parts which have been herein described and illustrated in order to explain the nature of this invention may be made by those skilled in the art within the principle and scope of the invention as expressed in the following claims.

We claim:

1. In a device for conveying printing plates by means of an endless conveyor from a machine for manufacturing the printing plates to a machine for folding the printing plates, the improvement wherein:
   the conveyor is a chain conveyor moving on rollers and which can be twisted, and which is guided in a guide rail which is horizontal in straight areas and which hangs at turning zones;
   a plurality of grippers are attached to the chain conveyor at spaced intervals, which can be swiveled and opened in a transfer station associated with said manufacturing machine, for receiving a printing plate as one of said grippers moves in said transfer station, and for releasing the received printing plate while moving in an unloading station associated with the folding machine;
   said grippers move parallel to an edge of the printing plate to be received; and
   the transfer station has connecting links for first swiveling and then opening said grippers to receive the printing plate.

2. The device of claim 1 wherein the printing plates are folded on opposing edges.

3. The device of claim 2 wherein the grippers are moved parallel to an unfolded edge in the transfer station and the unloading station.

4. The device of claim 1 wherein the unloading station has connecting links for first swiveling and then opening the gripper.

5. The device of claim 4 wherein an unloading head is located under the connecting links, to individually catch a released printing plate.

6. The device of claim 1 wherein the transfer station has an ascending area in which the printing plates are passed from a first conveyor segment to a second conveyor segment moving faster than the first conveyor segment.

7. The device of claim 1 wherein the grippers are equally spaced along the chain conveyor.

8. The device of claim 1 wherein the printing plates in the transfer station are pneumatically fixed in place.

9. In a device for conveying printing plates by means of an endless conveyor from a machine for manufacturing the printing plates to a machine for folding the printing plates, the improvement wherein:
   the conveyor is a chain conveyor moving on rollers and which can be twisted, and which is guided in a guide rail which is horizontal in straight areas and which hangs at turning zones;
   a plurality of grippers are attached to the chain conveyor at spaced intervals, which can be swiveled and opened in a transfer station associated with said manufacturing machine, for receiving a printing plate as one of said grippers moves in said transfer station, and for releasing the received printing plate while moving in an unloading station associated with the folding machine;
   said grippers move parallel to an edge of the printing plate to be received; and
   the unloading station has connecting links for first swiveling and then opening the gripper.

10. The device of claim 9 wherein the printing plates are folded on opposing edges.

11. The device of claim 10 wherein the grippers are moved parallel to an unfolded edge in the transfer station and the unloading station.

12. The device of claim 9 wherein the grippers are equally spaced along the chain conveyor.

13. The device of claim 9 wherein an unloading head is located under the connecting links, to individually catch a released printing plate.

14. A method for conveying printing plates from a plate manufacturing machine to a plate folding machine, comprising the steps of:
   transferring the plates from the plate manufacturing machine to a transferring station;
   activating the transferring station so as to cause said plates to ascend through an inclined area;
   transferring the plates from the top of said inclined area, by means of a gripper having connecting links for swiveling said gripper into an angle for receiving one of said plates and a connecting link for opening said gripper to accept said plate, said gripper being mounted on a twistable conveyor moving on rollers and which is guided on a guide rail which is horizontal in straight areas and which hangs at turning zones;
   moving said gripper along said conveyor to a plate unloading station; and
   causing said gripper to be swiveled into position and then opened by means of connecting links associated with said unloading station so that the plate is caused to be deposited into a receiving port of said unloading station.

* * * * *